US009250267B1

(12) United States Patent
Jackson et al.

(10) Patent No.: US 9,250,267 B1
(45) Date of Patent: Feb. 2, 2016

(54) APPARATUS FOR CONTROLLING A PREMISES FROM A REMOTE LOCATION

(75) Inventors: Stephen S. Jackson, Chapel Hill, NC (US); Jennifer G. Rasimas, Morrisville, NC (US)

(73) Assignee: AVAYA INC., Basking Ridge, NJ (US)

(*) Notice: Subject to any disclaimer, the term of this patent is extended or adjusted under 35 U.S.C. 154(b) by 2316 days.

(21) Appl. No.: 09/699,543

(22) Filed: Oct. 30, 2000

(51) Int. Cl.
| G06F 15/16 | (2006.01) |
| G08B 23/00 | (2006.01) |
| G08B 21/00 | (2006.01) |
| G08B 13/00 | (2006.01) |
| G01R 11/24 | (2006.01) |
| G08B 25/00 | (2006.01) |

(52) U.S. Cl.
CPC .............. *G01R 11/24* (2013.01); *G08B 25/001* (2013.01)

(58) Field of Classification Search
CPC ............................... G01R 11/24; G08B 25/001
USPC ........... 709/205, 220, 250; 340/517, 540, 541
See application file for complete search history.

(56) References Cited

U.S. PATENT DOCUMENTS

| 4,006,459 | A | * | 2/1977 | Baker et al. ..................... 340/5.6 |
| 5,140,258 | A | * | 8/1992 | Bishop ........................... 324/110 |
| 5,406,260 | A | | 4/1995 | Cummings et al. ............ 340/568 |
| 5,877,697 | A | * | 3/1999 | Paas et al. ..................... 340/5.31 |
| 6,145,351 | A | * | 11/2000 | Levenson .......................... 70/93 |
| 6,496,595 | B1 | * | 12/2002 | Puchek et al. ................. 382/124 |
| 6,535,983 | B1 | * | 3/2003 | McCormack et al. ........ 713/310 |
| 6,591,368 | B1 | * | 7/2003 | Ryu ............................. 713/323 |
| 6,614,450 | B1 | * | 9/2003 | Vossler ......................... 715/751 |
| 6,698,021 | B1 | * | 2/2004 | Amini et al. .................. 709/205 |

FOREIGN PATENT DOCUMENTS

| EP | 331654 | A2 | * | 9/1989 | |
| EP | 0331654 | A2 | * | 9/1989 | ............... G07C 9/00 |
| GB | 2131869 | A | * | 6/1984 | ............... E05C 1/06 |

OTHER PUBLICATIONS

Definition for "tamper", Cambridge Dictionaries Online, 2009.*

* cited by examiner

*Primary Examiner* — June Sison
*Assistant Examiner* — Adam Cooney
(74) *Attorney, Agent, or Firm* — Anderson Gorecki & Rouille LLP

(57) ABSTRACT

An apparatus and method of controlling a premises from a remote network device communicates with the remote network device via a local computer network associated with the premises. Specifically, the apparatus includes a peripheral device configured to execute a specific function at the premises, a communication engine operably coupled with the peripheral device for providing a logical connection with the remote network device via the local computer network, and a network interface operably coupled with the communication engine. The network interface transmits data to and receives data from the local computer network. Data transferred between the peripheral device and local computer network is forwarded via the network interface.

36 Claims, 8 Drawing Sheets

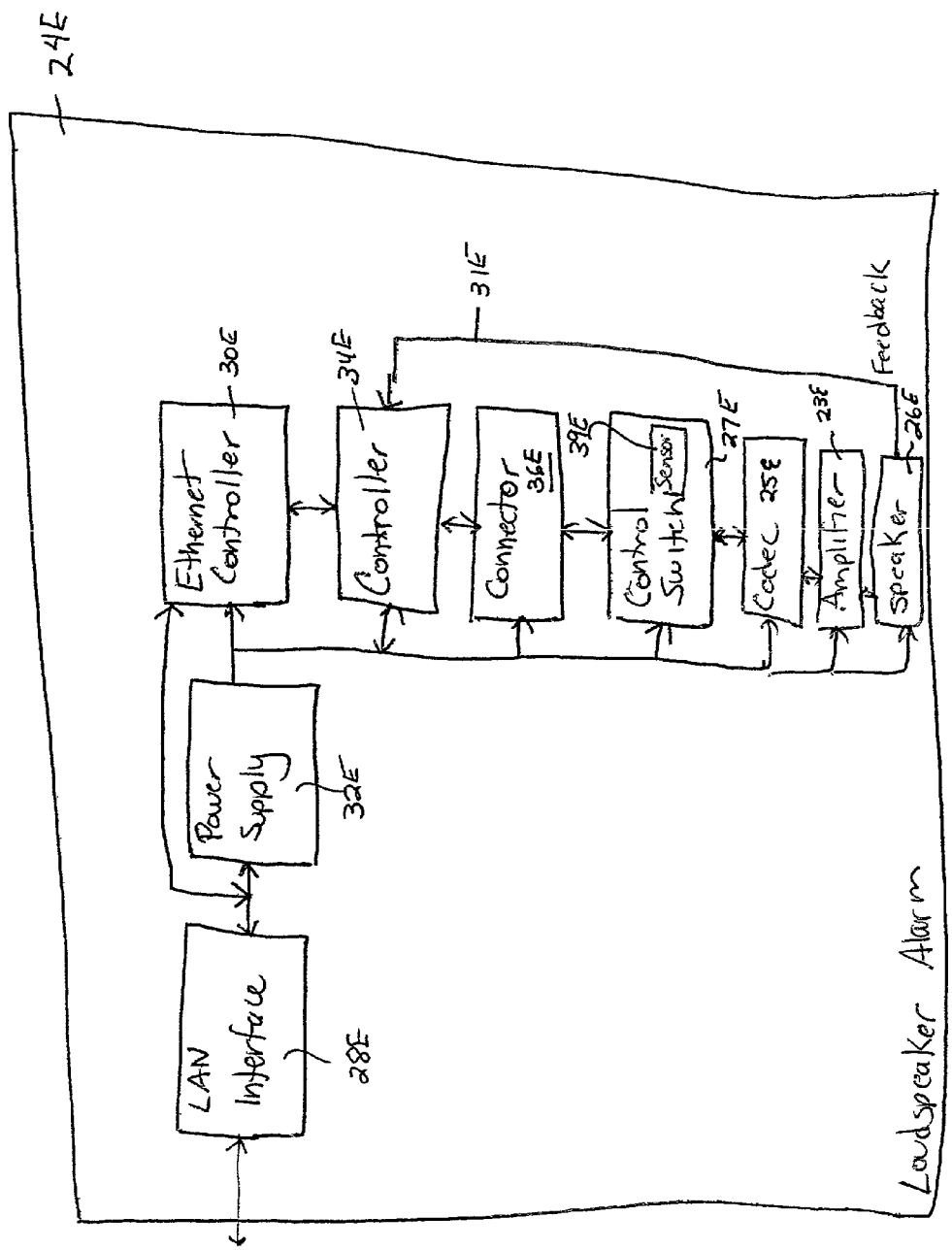

APPARATUS FOR CONTROLLING A PREMISES FROM A REMOTE LOCATION

FIELD OF THE INVENTION

The invention relates generally to data transmission networks and, more particularly, the invention relates to network devices used to control a premises from a remote location via a computer network.

BACKGROUND OF THE INVENTION

Various devices have been developed to control and/or monitor a site from a remote location. For example, many fire alarm systems in high rise buildings include the functionality to alert a remotely located fire station if a fire is detected in such buildings. Specifically, such a fire alarm system commonly includes a plurality of remote smoke/fire detectors and alarms that all are directly connected (e.g., via a twisted pair) to a central control panel. When one of the detectors senses a fire and/or smoke in the building, it transmits a signal to the central control panel, which consequently sets off the alarms. People who hear the alarms thus may evacuate the building.

The central control panel may include a modem that transmits a signal to the fire station when one or more of the remote detectors senses a fire. This signal is a direct circuit switched connection via the public switched telephone network ("PSTN"). To establish such a connection, the fire station must have a modem that can communicate with the modem on the central control panel. Problems arise, however, when something goes wrong at the fire station, or when the PSTN suffers some kind of link failure. In such case, the signal to the fire station is not properly transmitted to the fire station, thus eliminating the intended benefit of such a connection.

This type of alarm system also has service problems. Namely, if there is a mechanical problem with the fire alarm system, then the company servicing the system cannot diagnose the problem remotely. Accordingly, a technician must be sent to the building, thus incurring travel cost.

SUMMARY OF THE INVENTION

In accordance with one aspect of the invention, an apparatus and method of controlling a premises by messages received from a remote network device communicates with the remote network device via a local computer network associated with the premises. Specifically, the apparatus includes a peripheral device configured to execute a specific function at the premises, a communication engine operably coupled with the peripheral device for providing a logical connection with the remote network device via the local computer network, and a network interface operably coupled with the communication engine. The network interface transmits data to and receives data from the local computer network. Data transferred between the peripheral device and local computer network is forwarded via the network interface.

In some embodiments, the local computer network is a local area network using the Ethernet protocol, and the communication engine is an Ethernet controller. Accordingly, the communication engine translates data into frames for transmission across the network. The communication engine also may translate data from frames and forward such translated data to the peripheral device. The local computer network may be a power integrated network that transmits both power and data. The apparatus also may include a power circuit for converting power.

The peripheral device may be one or more of many different types of devices. Specifically, the peripheral device may be a door strike controller. In such case, the peripheral device also may include a sensor for identifying a person requesting access to the premises. The peripheral device also may include an alarm, a light, and/or a speaker.

In accordance with another aspect of the invention, an apparatus for controlling a door strike includes a mechanical strike control mechanism adapted to alternatively lock and unlock the door strike, a communication engine for communicating with a remote network device via a local computer network, and a strike controller operably coupled with the communication engine. The communication engine forms a logical connection with the remote network device via the local computer network. The strike controller causes the strike control mechanism to lock or unlock the door strike after receipt of a strike message from the remote network device. The strike message includes data that controls the strike control mechanism to lock or unlock the door strike.

In various embodiments, the remote network device may be coupled with a public network. The remote network device thus may communicate with the local computer network via the public network. In other embodiments, the strike control mechanism may include a solenoid that is controlled by a switch. A feedback module adapted to generate a feedback message with data for use by the remote network device also may be included. The feedback message indicates data indicating the state of the strike control mechanism. The apparatus also may include a tamper module that determines if the apparatus has been altered. The apparatus may be deemed to be altered if somebody tampered with its electronics or any part of its mechanical components. The tamper module may be adapted to generate a tamper message for transmission to the remote network device. The tamper message indicates if the apparatus has been altered. The tamper module may include the functionality to shut-off the apparatus if the apparatus has been altered.

In accordance with other aspects of the invention, an access control device for permitting a set of users to access a site also is coupled with a local computer network. Each user in the set of users has user parameters. The access control device includes a communication engine for communicating with a remote network device via the local computer network, a presence sensor having an input to receive user parameters, and a controller operably coupled with the communication engine. In a manner similar to other embodiments, the communication engine forms a logical connection with the remote network device. The controller is capable of both forwarding the received user parameters to the remote network device, and receiving an access message from the remote network device if the received user parameters match the user parameters of at least one of the set of users. The controller permits access to the site after receipt of the access message.

In accordance with still another aspect of the invention, an annunciator system for alerting people of an event within a site similarly is coupled with a local computer network. The annunciator system includes a communication engine for communicating with a remote network device via the local computer network, and an alarm providing an output stimulus both after detecting an environmental condition of the site and after receipt of an alarm message. The communication engine forms a logical connection with the remote network device. The annunciator system also includes a feedback module operably coupled with the communication engine for forwarding a state message (to the remote network device) identifying the state of the alarm, and an alarm control module operably coupled with the communication engine. The alarm control module forwards the alarm message to the alarm.

BRIEF DESCRIPTION OF THE DRAWINGS

The foregoing description of various embodiments of the invention should be appreciated more fully from the following further description thereof with reference to the accompanying drawings wherein:

FIG. 8 schematically shows an example of a network appliance configured in this embodiment as a loud speaker alarm.

DESCRIPTION OF ILLUSTRATIVE EMBODIMENTS

In illustrative embodiments, a network appliance at a local site is controlled by a remote network device via a local computer network. For example, the local network may be coupled with a public network, consequently enabling the appliance to communicate with the remote network device by means of a network layer protocol (e.g., the Internet Protocol). In other embodiments, a link layer protocol may be used. Accordingly, instead of a circuit switched connection, a logical connection is considered to exist between the network appliance and the remote network device. Such logical connection is controlled by an underlying data transport protocol and does not require a direct, circuit-switched type of connection. Details of various embodiments are discussed below.

Figure 1:
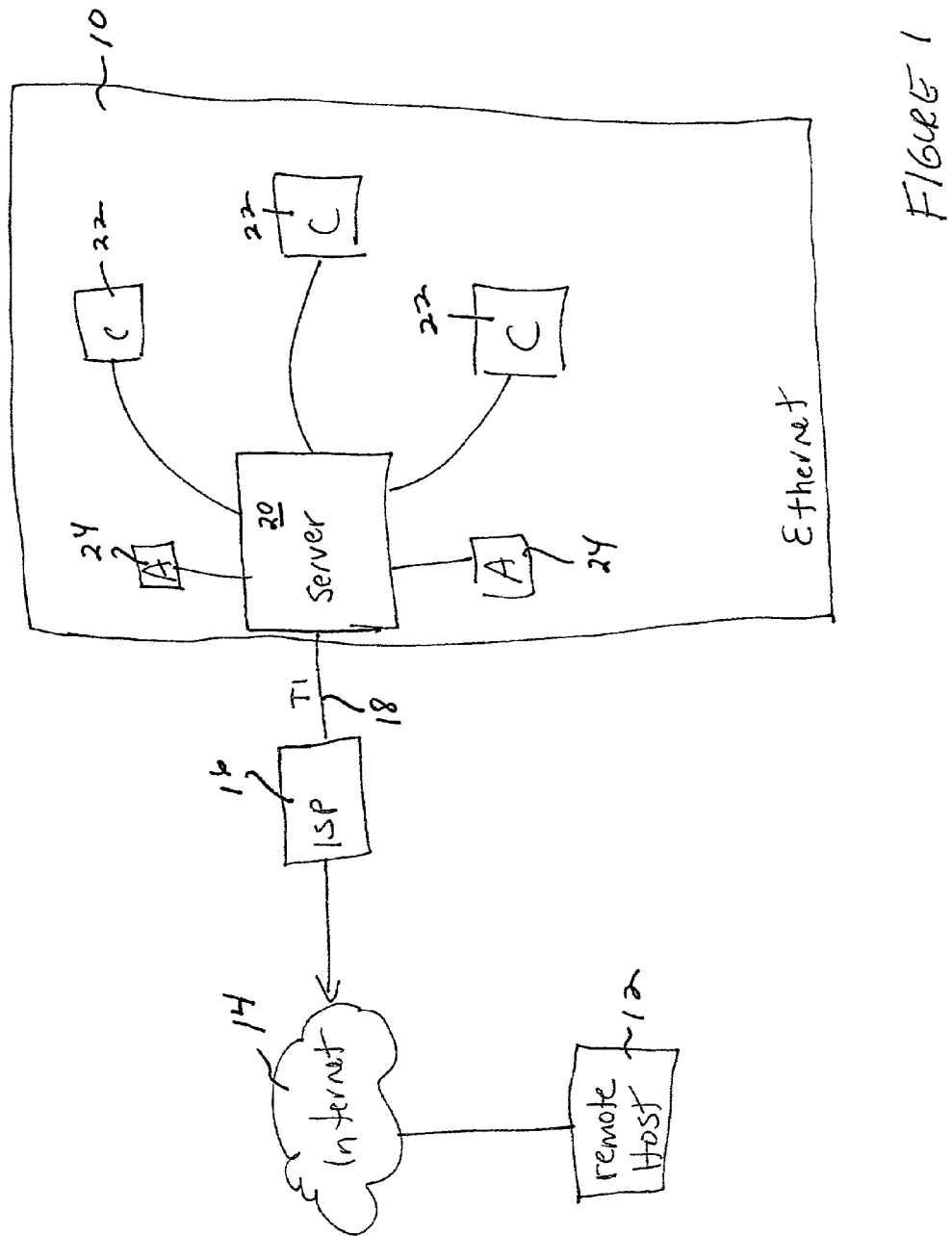
FIG. 1 schematically shows a well known network arrangement that may be used in connection with illustrative embodiments of the invention.

FIG. 1 schematically shows a well known network arrangement that may be used in connection with illustrative embodiments of the invention. Specifically, the network includes a local computer network 10 that is coupled with a remote host 12 via a public network 14 (e.g., the Internet, referred to herein as "Internet 14"). The remote host 12, which controls at least one network appliance 24 (discussed below) in the network 10, may be one or more stand-alone network device(s) (e.g., servers, programmable routers, or personal computers), or one or more network device(s) that is/are a part of a different local computer network (not shown). In illustrative embodiments, the local computer network 10 communicates with the Internet 14 via an Internet Service Provider ("ISP 16"). In alternative embodiments (not shown in the figures), the remote host 12 is located on the ISP 16.

To ensure rapid data transmission rates, the local computer network 10 is coupled with the ISP 16 via a high speed data transmission line 18, such as a T1 line. In alternative embodiments, a server 20 (discussed below) in the local computer network 10 is coupled with the ISP 16 by other known means, such as by a cable modem or telephone modem. Even though a portion of the connection may use the PSTN (i.e., the public switched telephone network) in some embodiments, the connection between the server 20 and the remote host 12 still remains a logical connection since data is transmitted to the remote host 12 using a network layer protocol (e.g., the Internet Protocol). Accordingly, data receipt by the remote host 12 is dependent upon its logical location (i.e., its IP address) and not upon its physical location.

The local computer network 10 may be any type of local computer network, such as a local area network that operates according to the Ethernet protocol. It should be noted, however, that like various other details of illustrative embodiments noted herein, discussion of an Ethernet network is exemplary and thus, not intended to limit embodiments of the invention. Accordingly, embodiments of the invention can be applied to other types of local computer networks, such as Token Ring local area networks.

In illustrative embodiments, the local computer network 10 is a power integrated network. Namely, the term "power integrated network" refers to a local network that transmits both power and data to member computer systems in the network. Such power may or may not be used by the member computer systems. Among other ways, the power and data may be transmitted on a single cable via different wires, or via the same wire. Illustrative power integrated networks include Power Ethernet networks, which implement the proposed IEEE 802.3af standard. Currently, this standard is in draft form and is expected to be completed and adopted sometime in late 2001. Computer systems utilizing this standard are capable of receiving power (e.g., about fourteen watts) and data from a computer cable across an IEEE DTE (data terminal equipment) through a MDI (media dependent interface) compliant port. It should be noted, however, that although Power Ethernet and this IEEE standard are discussed, various embodiments are not limited to such standard. Accordingly, various embodiments can be used on other types of networks that transmit both power and data.

The local computer network 10 includes the above noted server 20, which is coupled with three personal computers 22 and two network appliances 24. The server 20 may be any type of server used in a local area network. For example, the server 20 may be a stand-alone hardware server, or a software server implemented on a router or multiplexer. It also should be noted that different numbers of personal computers 22 and network appliances 24 than those shown may be used in the local computer network 10. In fact, in some embodiments, the local computer network 10 includes network appliances only.

Figure 2:
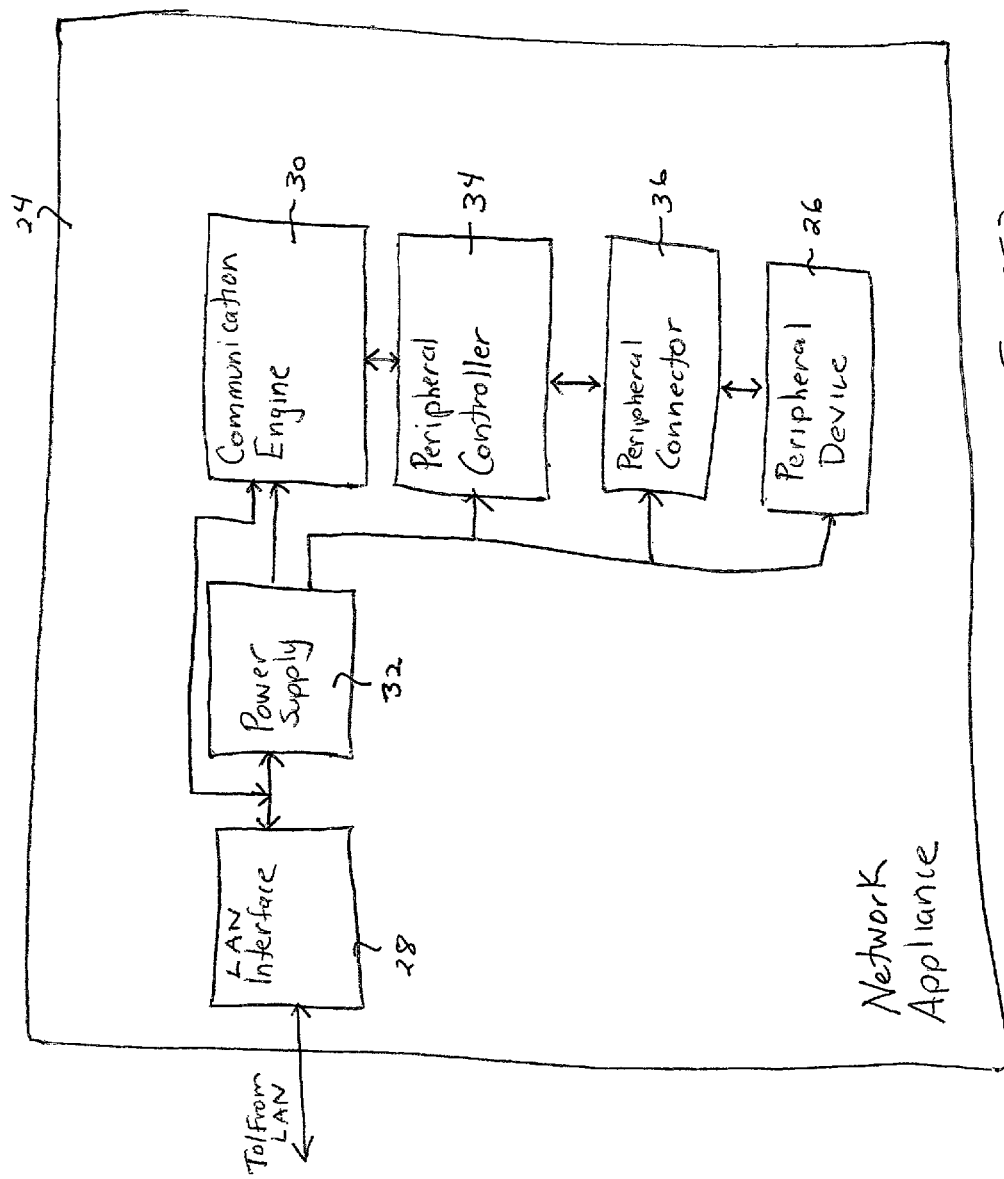
FIG. 2 schematically shows an example of a generic network appliance that may be configured in accordance with illustrative embodiments of the invention.

FIG. 2 schematically shows a generic network appliance 24 that may be configured in accordance with illustrative embodiments of the invention. The network appliance 24 is a specially configured network device that includes a peripheral device 26 for executing a specified function. Among other things, the peripheral device 26 may control a door strike and/or access to a site, alert people in a building of an emergency, or simply record a temperature at a site. Additional examples of peripherals 26 may include a speech recognition module, physical presence module, microphone, camera, display monitor, laser detector, light switch, thermostat, power outlet, and appliance controller (e.g., to control a kitchen appliance).

To that end, the network appliance 24 includes a local area network interface ("LAN interface 28") that is configured to be coupled with the server 20 (i.e., the local computer network 10), a communication engine 30 to control data transmission across the local computer network 10 and public network 14, and a power supply 32 to receive and convert power received from the power integrated network for use by the appliance 24. In addition, the appliance 24 also includes a peripheral controller 34 that is pre-configured with the logic to control the attached peripheral device 26, and a peripheral connector 36 for easily coupling the peripheral device 26 with the appliance 24.

In illustrative embodiments, the power supply 32 is a simple down converter that converts an incoming DC voltage to a lower DC level. In some embodiments, the power supply 32 is not necessary when the network appliance 24 is configured to operate with the exact power being supplied by the local network 10. When not used with a power integrated network, the power supply 32 can include more complex circuitry, such as rectification and smoothing circuitry. Moreover, the LAN interface 28 can be a conventional plug for plugging into the Ethernet network 10.

The peripheral device 26 preferably is easily separable from the rest of the appliance. Specifically, the LAN interface 28, power supply 32, communication engine 30, peripheral controller 34, and peripheral connector 36 may be considered to be a single operating unit to which the peripheral device 26 is connected. Simple mechanical connectors can connect the peripheral device 26 to the single operating unit. For example, the peripheral connector 36 may include three connecting fingers (not shown) that mate with corresponding holes on the peripheral device 26. The mating may occur through any conventional means, such as by twisting, or with the fingers acting as leaf springs. Once connected, electrical leads of the various components are positioned to effectively electrically couple all components of the single unit with the peripheral device 26. Use of this simple connection simplifies repair of the network appliance.

In some embodiments, the above noted single operating unit is programmable to be used with multiple different types of peripheral devices 26. Such type of unit thus may include a single common interface having a standard set of specified commands to communicate with the different peripheral devices 26. The interface may include, for example, an application programming interface ("API").

Figure 3:
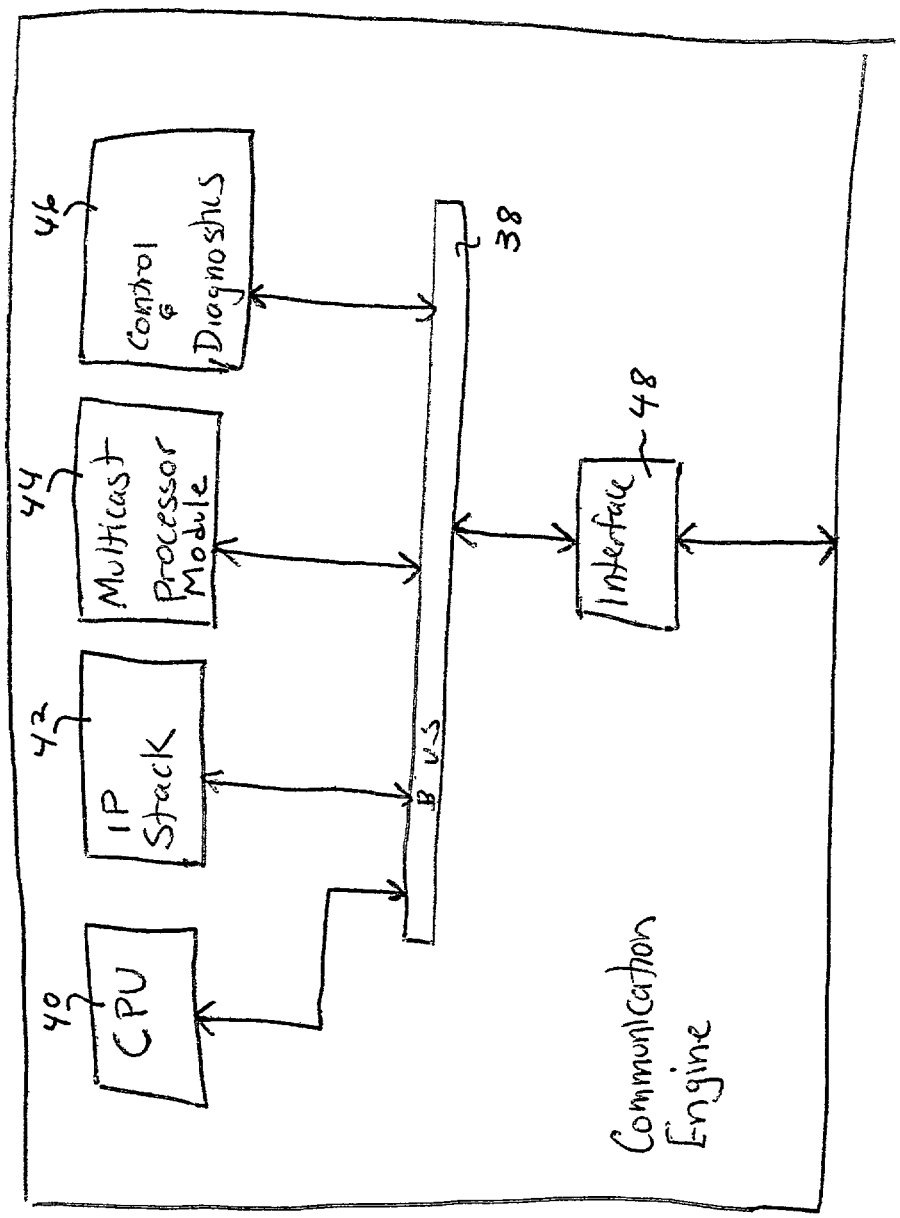
FIG. 3 schematically shows an example of a communication engine that may be in the network appliance of FIG. 2.

FIG. 3 schematically shows additional details of the communication engine 30 within the network appliance 24 of FIG. 2. The communication engine 30 includes a plurality of functional modules that each communicate via a bus 38. In particular, the functional modules include a central processing unit 40 for executing the various processes of the communication engine 30, an IP stack 42 for executing all network communication processes, and an optional multicast processor module 44 for providing multicast capabilities to the network appliance 24. In addition, the communication engine 30 also includes a control and diagnostic module 46 for controlling the overall operation of the communication engine 30 and providing diagnostic functionality from the remote host 12, and an interface 48 for providing an interface for data transmission to and from the communication engine 30.

In illustrative embodiments, the central processing unit 40 is a relatively low power, high performance microprocessor. For example, a CRUSOE™ microprocessor executing an operating system based upon the VXWORKS™ operating system may be used for such purposes. The CRUSOE™ microprocessor is distributed by Transmeta Corporation of Santa Clara, Calif. The VXWORKS™ operating system is distributed by Wind River Systems, Inc. of Alameda, Calif. Of course, use of these elements is not necessary since other processors and operating systems may be used. Discussion of these elements thus are for illustrative purposes only.

The IP stack 42 preferably includes the link layer, network layer, and transport layer (i.e., layers two, three, and four, respectively, of the OSI model) software and/or hardware that permits the network appliance 24 to transmit to and receive data from the remote host 12 via the local computer network 10. In illustrative embodiments, the communication engine 30 is an Ethernet controller that includes code for implementing the Ethernet protocol, and code for implementing TCP/IP (i.e., Transmission Control Protocol with the Internet Protocol).

The multicast processor module 44 preferably is a software device that implements one or more multicast protocols (e.g., Protocol Independent Multicast, also known as "PIM"). Accordingly, the multicast processor module 44 includes the functionality to transmit data messages to a specified set of other network devices either on the local computer network 10, or across the Internet 14. For example, if one network appliance 24 includes a fire alarm, then the multicast processor module 44 may transmit an alarm message to the remote host 12 notifying it of an emergency (e.g., a fire in the building). In addition, the multicast processor module 44 also may transmit the same alarm message to specified other network appliances 24 acting as a fire alarms. Upon receipt of the alarm message, each other such network appliance 24 also may sound its local alarm, thus providing warning of the emergency condition.

As noted above, the control and diagnostic module 46 controls the communication engine 30, and provides diagnostic capabilities. For example, an operator at the remote host 12 may transmit a message inquiring about whether the peripheral device 26 is connected to the appliance 24. The control and diagnostic module 46 consequently may determine, via conventional means, if such device is connected. If not connected, then the control and diagnostic module 46 may transmit a reply message back to the remote host 12 indicating that no peripheral device 26 is connected. This saves the trouble of having to send a technician to the site to make this determination. Of course, discussion of this diagnostic function is exemplary and thus, not intended to limit the scope of the invention. The control and diagnostic module 46 therefore may be configured to perform other diagnostic functions.

Figure 4:
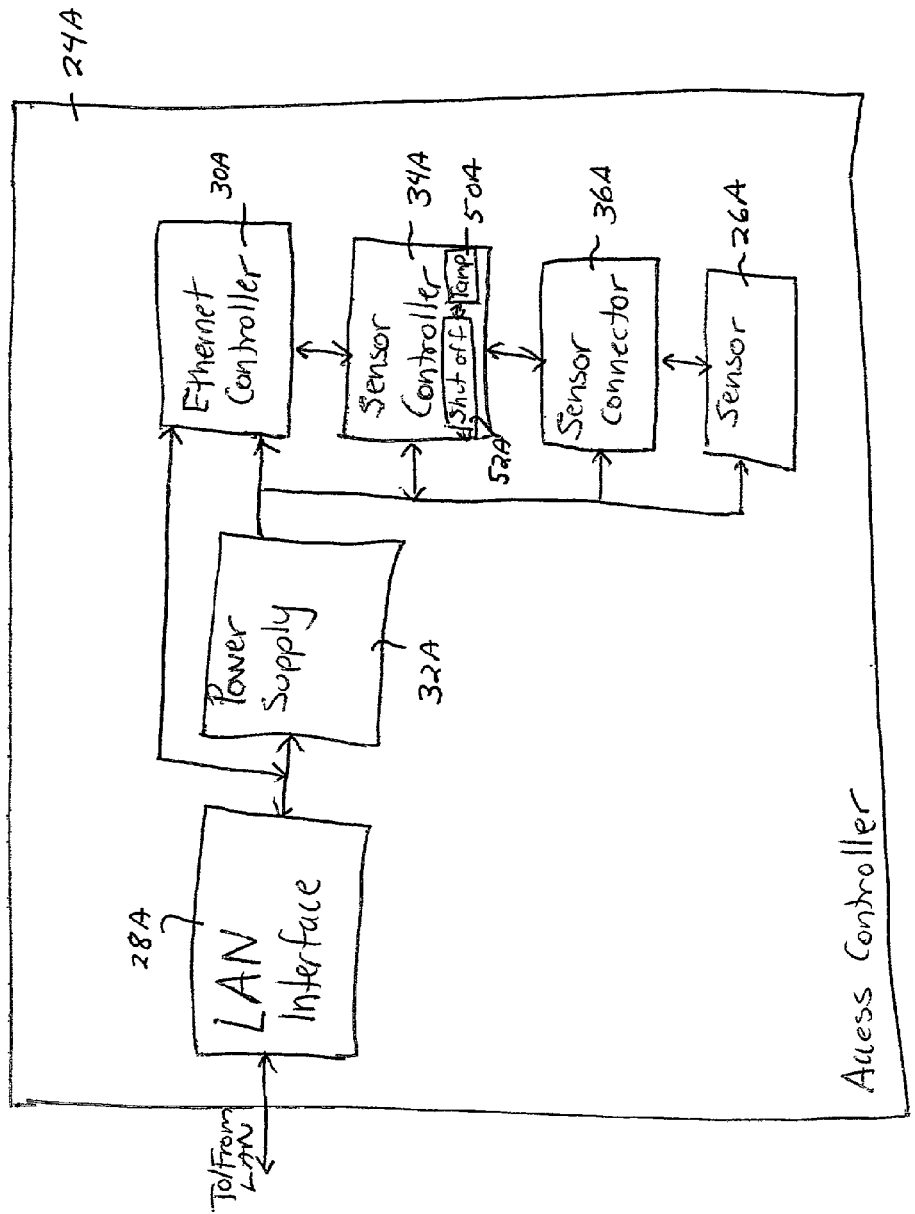
FIG. 4 schematically shows an example of a network appliance configured in this embodiment as an access controller.

FIGS. 4-8 schematically show various exemplary network appliances 24 that utilize the basic platform shown in FIG. 2. In particular, FIG. 4 schematically shows an access controller 24A that controls access to a particular site. Such site can be any geographical region, such as a room in a building that has a door (not shown) for access. Other illustrative regions may include a boat, a car, a cabinet, or a portable telephone. A room in a building will be discussed below to exemplify one use of such device. It should be noted, however, that discussion of a room in a building is not intended suggest that the device cannot be used in other sites. In this example, the access controller 24A first determines whether a person requesting access can access the room. If the person can access the room, then a message is transmitted to the door, causing it to unlock. Details are discussed below.

The access controller 24A includes a LAN interface 28A for interfacing with the local computer network 10, a power supply 32A, and an Ethernet controller 30A, each of which are discussed above. In addition, the access controller 24A also includes a sensor 26A to sense a person's presence, a sensor connector 36A for mechanically connecting the sensor 26A to the appliance 24A, and a sensor controller 34A for controlling operation of the sensor 26A and appliance 24A. Each of the functional modules in the access controller 24A (i.e., the Ethernet controller 30A, sensor controller 34A, sensor connector 36A—if necessary, and sensor 26A) receive power, during operation, from the power supply 32A.

The sensor controller 34A includes a tamper module 50A for detecting whether the appliance 24A has been altered (discussed below), and a shut-off switch 52A for shutting off the sensor 26A if it has been determined that the appliance 24A has been altered. The appliance 24A may be deemed to have been altered according to any known method, such as by detecting if some specified mechanical or electrical change has occurred to the appliance 24A since the device was powered-up. For example, the tamper module 50A may include a sensor that detects if the housing (not shown) surrounding the appliance 24A has been removed. If removed, then the tamper module 50A may transmit a signal to the shut-off module, thereby cutting power from the power supply 32A to the other functional modules. As a further example, the tamper module 50A may include circuitry to detect if power from the power supply 32A has been interrupted since power-up. Such interruption can suggest that somebody has tampered with the wires of the appliance 24A. Accordingly, in such instance, the tamper module 50A can cut power from the power supply 32A and/or notify the remote host 12.

The sensor 26A may be any type of presence detector. For example, the sensor 26A may be a card swipe device that reads code from a card inserted into it, and permits access when the code matches one of a set of preselected codes. In other embodiments, the sensor 26A may be another type of sensor, such as a biometric sensor. For example, the sensor 26A may be responsive to some physical characteristic of a person, such as a person's retina or finger print, or be responsive to a person's voice. Any type of sensor known in the art that may be configured to cooperate with the appliance 24A may be used.

When in use, the presence of a person requesting access ("requestor") is detected by the sensor 26A. As noted above, this can include any type of sensor. If a voice sensor is used, then the requestor speaks into a microphone. The sensor controller 34A thus may include a codec that converts the voice signal into an electronic signal. The sensor controller 34A then forwards this electronic signal, along with instructions to transmit the signal to the remote host 12, to the Ethernet controller 30A. After receipt, the IP stack 42 of the Ethernet controller 30A encodes the signal into packets for transmission to the remote host 12. Once transmitted through the LAN interface 28A, the data is transmitted from the server 20, to the ISP 16, across the Internet 14, to the remote host 12.

The remote host 12 may have a local database listing voice patterns of people who can access the site being protected by the access controller 24A. Accordingly, upon receipt, the remote host 12 parses the packetized data to determine the origin of the message (i.e., the site being protected), and then accesses the local database to determine if the voice data matches a stored voice pattern for such site in the database. If a match occurs, then the remote host 12 will transmit an access message via TCP/IP back to the access controller 24A.

Upon receipt of the access message through the LAN interface 28A, the Ethernet controller 30A assembles the actual data from the packets, and then forwards such data to the sensor controller 34A. The sensor controller 34A then indicates to a door controller (see FIG. 5) that access is permitted. To that end, a signal requesting that the door be unlocked is transmitted to the door controller, thus unlocking the door and permitting access to the site.

If the remote host 12 does not find a matching stored voice pattern in the local database, then appropriate action may be taken. In particular, a message may be sent to a security desk indicating that an unauthorized person is attempting to access the site. Some embodiments store data of specified people who are not permitted to access the site. For example, a former employee who works for a competitor may be specifically denied access. In such case, security may be called, and the people who control the site are on notice about actions of specified people.

Figure 5:
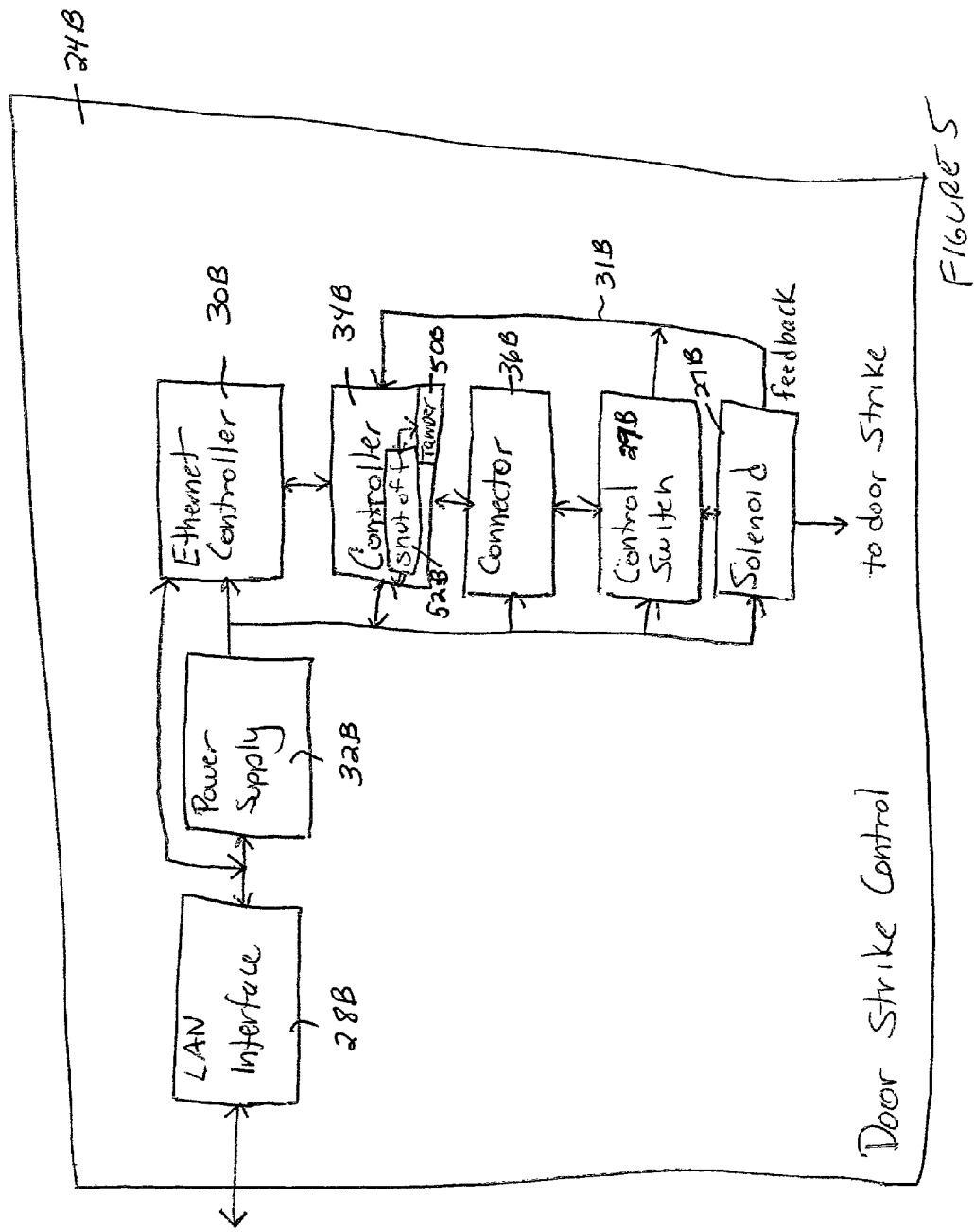
FIG. 5 schematically shows an example of a network appliance configured in this embodiment as a door strike controller.

FIG. 5 schematically shows a door strike controller 24B that may be used in conjunction with, or separate from, the access controller 24A of FIG. 4. The door strike controller 24B includes a LAN interface 28B for interfacing with the local computer network 10, a power supply 32B, and an Ethernet controller 30B, each of which are discussed above. In addition, the door strike controller 24B includes a controller 34B for controlling the attached peripheral device 26B, a connector 36B for connecting the peripheral device 26B, and the peripheral device 26B. The peripheral device 26B includes a solenoid 27B for physically moving the door strike to unlock and lock the door, and a control switch 29B that controls the energization of the solenoid. The solenoid 27B and/or control switch 29B also include a feedback path 31B that indicates whether the door strike is in an unlocked position or locked position. In a manner similar to the access controller 24A, the controller 34B also includes a tamper module 50B and a shut-off module 50B, both of which may operate in a similar manner to those in the access controller 24A.

As suggested above, the door strike controller 24B may be controlled by a local access controller, such as that shown in FIG. 4, or some other local network device on the local computer network 10. In a manner similar to the access controller 24A, however, the door strike controller 24B also may be controlled by the remote host 12. To that end, the remote host 12 may transmit a strike message across the Internet 14, which is received by the Ethernet controller 30B via the LAN interface 28B. After it is withdrawn from data packets, the strike message is forwarded to the controller 34B. Based upon the commands in the strike message, the controller 34B then determines whether the door strike is to be in the unlocked or locked position. Once this is determined, the controller 34B forwards a command to the control switch 29B to either unlock or lock the strike. The control switch 29B consequently switches current on in a specified direction within the solenoid 27B, depending upon whether it is to lock or unlock the strike. The feedback path 31B can transmit a signal to the controller 34B, confirming that the commands within the strike message were properly executed.

The remote host 12 also can determine if the strike is in an unlocked position or a locked position. Stated another way, the remote host 12 can determine the status of the door strike. In some embodiments, the controller 34B is coupled with a strike sensor (not shown) that determines whether the strike is in the locked position or unlocked position. The strike sensor may be any type of sensor, such as a microswitch that mechanically is contacted by the strike when in one position, or a magnetic field detector (e.g., a Hall sensor) that detects the position of a magnet on the strike.

To determine the status of the strike, the remote host 12 can transmit a status inquiry to the door strike controller 24B. Upon receipt, the controller 34B uses the sensor to determine if the strike is in the locked position or unlocked position. Once it determines the state, the controller 34B can transmit a state message to the remote host 12 indicating the state of the strike. Of course, all transmissions include use of the logical connection between the door strike controller 24B and the remote host 12.

Figure 6:
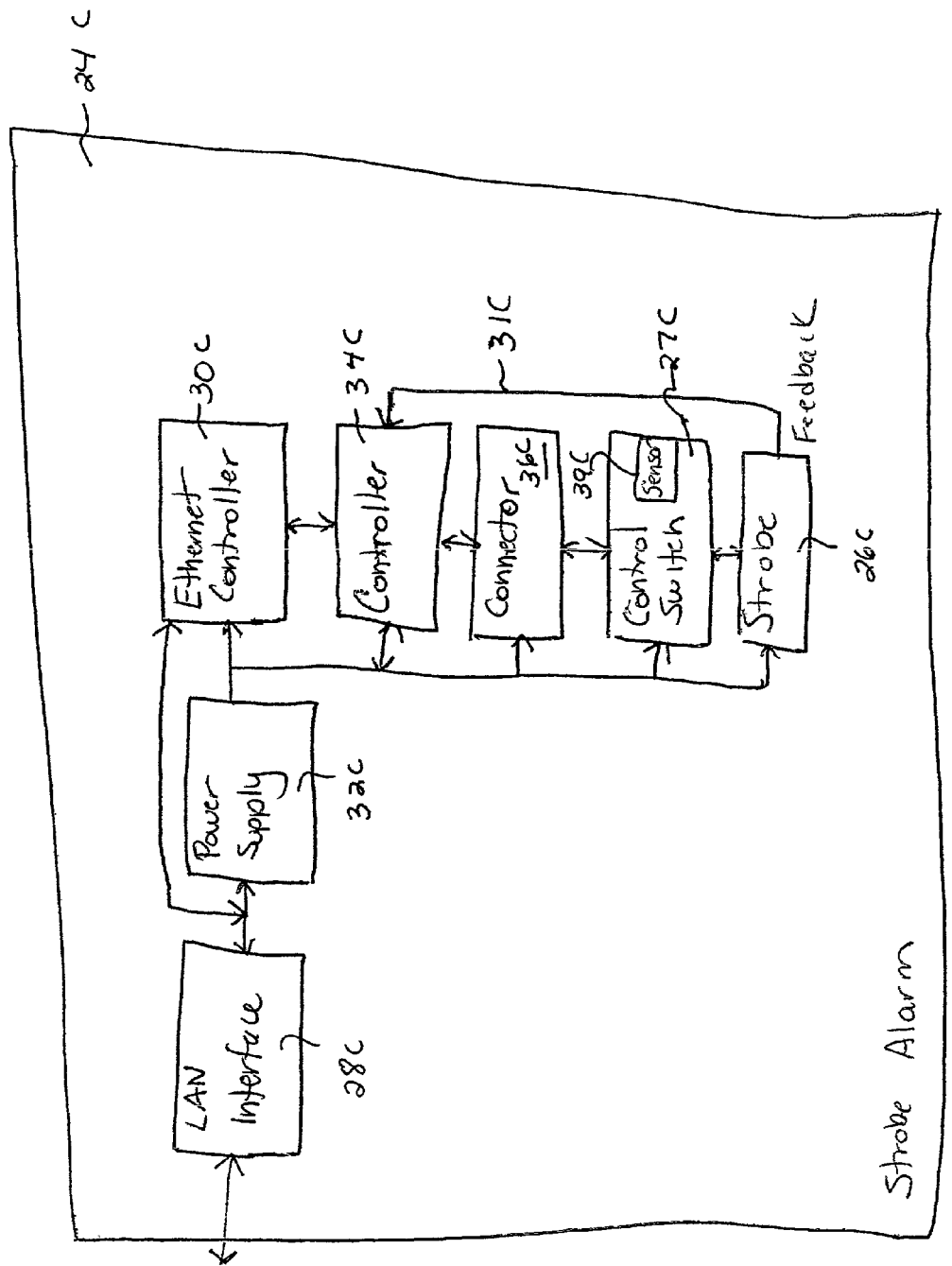
FIG. 6 schematically shows an example of a network appliance configured in this embodiment as a strobe alarm.
Figure 7:
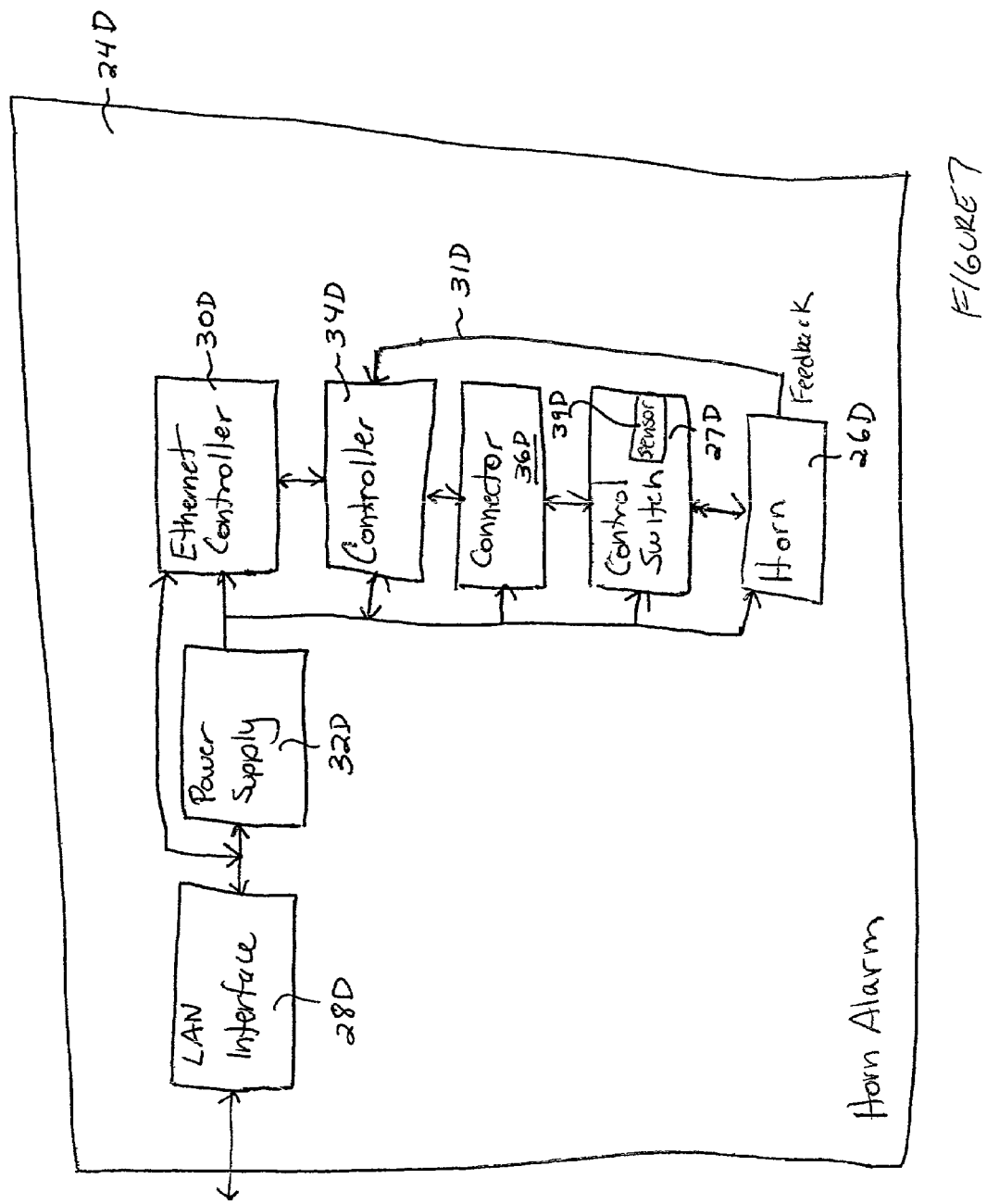
FIG. 7 schematically shows an example of a network appliance configured in this embodiment as a horn alarm.

FIGS. 6-8 schematically show different embodiments of an alarm appliance ("alarm 24G"). Each embodiment of the alarm 24G can include differing peripherals 26, such as a strobe 26C (FIG. 6), a horn 26D (FIG. 7), and/or a speaker 26E with amplifier 23E and codec 25E (FIG. 8). Each alarm 24G includes a LAN interface (respectively identified as LAN interfaces 28C, 28D, and 28D), a power supply (respectively identified as power supplies 32C 32D, and 32D), and an Ethernet controller (respectively identified as Ethernet controllers 30C, 30D, and 30E) as discussed above. In a similar manner, each alarm 24G also includes a controller (respectively identified as controllers 34C, 34D, and 34E) to control its respective peripheral, a connector (respectively identified as connectors 36C, 36D, and 36E) for easily connecting the peripheral, and a control switch (respectively identified as switches 27C, 27D, and 27E) to switch the peripheral on or off. The control switches 27C, 27D, and 27E each also may include a sensor (respectively identified as sensors 39C, 39D, and 39E) to detect some condition at the site, such as smoke or fire. In some embodiments, however, the sensors 39C, 39D and 39E may be a part of another device. Accordingly, in either case, the sensors 39C, 39D, and 39E may transmit an alarm signal to the controller 34C, 34D, and 34E when a specified condition is detected (e.g., smoke or fire). A feedback path (respectively identified as path 31C, 31D, and 31E) also may be coupled between the peripheral and the controller 34C, 34D, and 34E to enable the host to determine the state of the peripheral.

Use of the alarm 24G now will be discussed. It should be noted that the description may mention an element with three corresponding reference numbers. For example, the feedback path may be followed by reference numbers 31C, 31D, and 31E. Of course, only one of such type of element (e.g., only one feedback path) is necessary, however, when executing the noted functions. Inclusion of all three corresponding reference numbers is for completeness only.

When in use, the remote host 12 may transmit a status inquiry message requesting the status of the peripheral (e.g., it may request information to determine if the strobe 26C is flashing and/or if it is operational). After receipt of the status inquiry message, the controller 34C, 34D, and 34E may first determine the status of the peripheral via the feedback line 31C, 31D, and 31E, and then transmit a status reply to the remote host 12. The status reply includes data indicating the status of the peripheral.

The multicast processor module 44 in the Ethernet controller 30C, 30D, and 30E may be used to notify all alarms in the local computer network 10 of an emergency condition. For example, each alarm 24G may be on a different floor in a multi-story building. If a fire is detected on one floor, such alarm 24G may access its multicast table to determine the MAC address of the other alarms 24G on other floors in the building. Once determined, the multicast processor module 44 may multicast an alarm message with instructions to all other alarms 24G in the local computer network 10. Such instructions may cause the receiving alarms 24G to energize their peripheral (e.g., their horn or strobe). The multicast processor module 44 also may multicast the alarm message to the remote host 12, thus alerting the remote host 12 of the sensed condition and/or the state of the peripheral.

As noted above, different peripherals can be used, such as a thermometer, radio, video monitor, etc. . . . Accordingly, use of a logical connection provides a more reliable system since the message can be directed to the remote host 12 through a plurality of different routes. In addition, use of a power integrated network simplifies installation since separate power electronics are not required to be installed and/or included in the appliance. Remote access by the remote host 12 also reduces diagnostic and repair costs since a service call is not necessary for many common problems. Moreover, use of a simple connector 36A-36E for connecting the peripheral significantly simplifies repair in the event that the peripheral must be replaced.

As suggested above, some embodiments of the invention may be implemented at least in part in any conventional computer programming language comprising computer program code. For example, preferred embodiments may be implemented in a procedural programming language (e.g., "C") or an object oriented programming language (e.g., "C++"). Alternative embodiments of the invention may be implemented as preprogrammed hardware elements (e.g., application specific integrated circuits, FPGAs, and digital signal processors), or other related components.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

What is claimed is:

1. A system for use with controlled devices which are pre-installed at a premises, comprising:
   a host device comprising a processor and memory that is remotely located from the premises; and
   a plurality of peripheral controlling devices located at the premises, each peripheral controlling device associated with a controlled device and comprising:
   a processor;
   a memory;
   instructions stored in the memory and executed by the processor;
   a mounting connector via which the peripheral controlling device is mounted to the associated controlled device;
   a controller adapted to exert control over an input of the associated controlled device and detect status of the associated controlled device; and
   a communication engine which provides a logical connection with the remote host device and other peripheral controlling devices located at the premises via a computer network, the communication engine configured to transmit data including an indication of associated controlled device status to the remote host device and the other peripheral controlling devices;
   wherein each controlled device is configured to perform a primary function in response to a primary input which is not provided by the associated peripheral controlling device;
   wherein the instructions in the memories of the peripheral controlling devices cause each peripheral controlling device to exert control over the associated controlled device responsive to data from another peripheral controlling device indicative of a status change associated with the primary function; and
   wherein the instructions in the memories of the peripheral controlling devices cause each peripheral controlling device to respond to signaling from the host device to change exertion of control over the associated controlled device.

2. The system of claim 1 wherein the controller exerts control over the associated controlled device mechanically.

3. The system of claim 1 wherein the controller exerts control over the associated controlled device electrically.

4. The system of claim 1 wherein the status change is indicative of an emergency.

5. The system of claim 1 wherein the controlled device includes a door, and the associated peripheral controlling device includes a door strike controller.

6. The system of claim 5 wherein the peripheral controlling device includes a sensor for identifying a person requesting access to the premises.

7. The system of claim 1 wherein the peripheral controlling device includes at least one of: an alarm, thermometer, radio, video monitor, speech recognition module, physical presence module, card reader, microphone, camera, laser detector, light switch, power outlet and appliance controller.

8. The system of claim 1 wherein the controlled device includes at least one of: an alarm, a light and a speaker.

9. The system of claim 1 wherein each peripheral controlling device includes an interface adapted to connect to a power integrated network which carries both power and data in one cable.

10. The system of claim 1 wherein each peripheral controlling device further comprises a multicast processor module that transmits a message to specified controlling devices using multicast.

11. The system of claim 1 wherein each peripheral controlling device further comprises a tamper module that indicates whether the peripheral controlling device has been altered.

12. The system of claim 11 wherein the tamper module is adapted to generate a tamper message which is transmitted to the remote host device, the tamper message indicating that the peripheral controlling device has been altered.

13. The system of claim 11 wherein the tamper module includes a shut-off module that shuts down the peripheral controlling device if the tamper module determines that the peripheral controlling device has been altered.

14. A method for controlling controlled devices which are pre-installed at a premises, comprising:
   mounting ones of a plurality of controlling devices to associated ones of a plurality of controlled devices using mounting connectors, each controlled device configured to perform a primary function in response to a primary input which is not provided by the associated controlling device;
   using a controller of each controlling device, selectively exerting control over the associated controlled device and detecting status of the associated controlled device;
   providing logical connections between each controlling device and a remote host device and other controlling devices at the premises via a computer network;
   transmitting data including an indication of controlled device status change associated with the primary function to the remote host device and the other controlling devices;
   at least in part in response to the data, the other controlling devices exerting control over the associated controlled devices; and
   causing the controllers to change exertion of control over the associated controlled devices by signaling from the host device to the controllers.

15. The method claim 14 including exerting mechanical control over the controlled device.

16. The method of claim 14 including exerting electrical control over the controlled device.

17. The method of claim 14 including generating data indicative of an emergency condition.

18. The method of claim 14 wherein the controlled device includes a door, and the associated controlling device includes a door strike controller, and including exerting control over the door using the strike controller.

19. The method of claim 18 wherein the controlling device includes a sensor, and including using the sensor to identify a person requesting access to the premises.

20. The method of claim 14 including the controlling device using at least one of: an alarm, thermometer, radio, video monitor, speech recognition module, physical presence module, card reader, microphone, camera, laser detector, light switch, power outlet and appliance controller.

21. The method of claim 14 including the controlled device using at least one of: an alarm, a light and a speaker.

22. The method of claim 14 including the controlled device and controlling device utilizing a power integrated network which carries both power and data in one cable.

23. The method of claim 14 wherein each controlling device further comprises a multicast processor module, and including the module transmitting a message to specified controlling devices.

24. The method of claim 14 further including using a tamper module to determine if the controlling device has been altered.

25. The method of claim 24 including the tamper module generating a tamper message to the remote host device, the tamper message indicating that the controlling device has been altered.

26. The method of claim 24 including the tamper module using a shut-off module to shut down the controlling device if the tamper module determines that the controlling device has been altered.

27. An apparatus comprising:
   a first communication device which is adapted to be connected to a first peripheral device which is pre-installed at a premises before the first communication device is connected to the first peripheral device, the first peripheral device configured to perform a primary function in response to a first input which is not provided by the first communication device, the first communication device comprising:
      a processor;
      a memory;
      a controller adapted to exert control over an input of the associated first peripheral device and detect status of the associated first peripheral device;
      a communication engine which provides a logical connection between the first peripheral device and a first remote host device via a computer network, the communication engine adapted to provide an indication of status of the first peripheral device to the first remote host device; and
   instructions stored in the memory and executed by the processor to exert control over the associated first peripheral device responsive to data indicative of a status change associated with the primary function, and to respond to signaling from the first remote host device to change exertion of control over the associated first peripheral device.

28. The apparatus of claim 27 in which the first input is provided by a first device which is not in communication with the first communication device.

29. The apparatus of claim 27 in which the first peripheral device is configured to provide a status indication to a second device which is not in communication with the first communication device.

30. The apparatus of claim 27 in which the first communication device further comprises a controller which is adapted to exert control over the primary function of the first peripheral device.

31. The apparatus of claim 30 in which the first communication device communicates the indication of status of the first peripheral device to a second communication device associated with a second peripheral device located at the premises, the second peripheral device configured to perform a primary function in response to a second input which is not provided by the second communication device.

32. The apparatus of claim 31 in which the second communication device exerts control over the primary function of the second peripheral device in response to an indication of a change in status of the first peripheral device.

33. The apparatus of claim 27 in which diagnoses the first peripheral device is performed at the remote device.

34. The apparatus of claim 27 in which the first peripheral device includes a fire alarm.

35. The apparatus of claim 34 in which the fire alarm is in communication with a fire department via a network other than the computer network.

36. The apparatus of claim 27 in which the first peripheral device includes a door strike.

\* \* \* \* \*